(12) United States Patent
Yang

(10) Patent No.: US 7,431,813 B2
(45) Date of Patent: Oct. 7, 2008

(54) MULTI-CHAMBERED SUBSTRATE PROCESSING EQUIPMENT HAVING SEALING STRUCTURE BETWEEN CHAMBERS THEREOF, AND METHOD OF ASSEMBLING SUCH EQUIPMENT

(75) Inventor: Kyoung-Seok Yang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 189 days.

(21) Appl. No.: 11/369,742

(22) Filed: Mar. 8, 2006

(65) Prior Publication Data

US 2007/0114440 A1 May 24, 2007

(30) Foreign Application Priority Data

Nov. 11, 2005 (KR) ...................... 10-2005-0108048

(51) Int. Cl.
*G21K 5/10* (2006.01)
*H01L 21/00* (2006.01)
*C23C 16/00* (2006.01)

(52) U.S. Cl. ........................... 204/298.35; 250/440.11; 250/441.11; 118/733; 216/67; 156/345.51

(58) Field of Classification Search ............ 250/440.11, 250/441.11; 204/298.35; 118/733; 156/345.51; 216/67

See application file for complete search history.

(56) References Cited

U.S. PATENT DOCUMENTS

| 5,405,480 | A | 4/1995 | Benzing et al. |
| 5,415,729 | A * | 5/1995 | Strasser et al. ................. 216/67 |
| 6,508,885 | B1 * | 1/2003 | Moslehi et al. ............. 118/728 |
| 6,907,924 | B2 * | 6/2005 | Moslehi ....................... 165/275 |

* cited by examiner

*Primary Examiner*—Nikita Wells
(74) *Attorney, Agent, or Firm*—Volentine & Whitt, PLLC

(57) ABSTRACT

Sealing structure provided between a transfer chamber and a chamber, such as a process chamber, connected to the transfer chamber includes an insert member, a docking member, and annular seals. The insert member is fixed to the exterior of the transfer chamber and the docking member is fixed to the insert member. The docking member has an extension received in a passageway of the process chamber, a support portion received in the insert member, and a flange received in a passageway of the transfer chamber. The extension, support portion and flange have different outer diameters in cross section such that inclined surfaces extend between the outer peripheral surfaces of the flange, the support portion and the extension. The annular seals are disposed along the inclined surfaces, and the extension prevents the annular seal from being damaged by plasma used to process a substrate in the process chamber.

19 Claims, 6 Drawing Sheets

MULTI-CHAMBERED SUBSTRATE PROCESSING EQUIPMENT HAVING SEALING STRUCTURE BETWEEN CHAMBERS THEREOF, AND METHOD OF ASSEMBLING SUCH EQUIPMENT

BACKGROUND OF THE INVENTION

1. Field of the Invention

The present invention relates to substrate processing equipment and, in particular, to multi-chambered processing equipment for use in manufacturing semiconductor devices or the like. More specifically, the present invention relates to structure used to create a seal between a chamber, such as a process chamber, and a transfer chamber of multi-chambered substrate processing equipment.

2. Description of the Related Art

Semiconductor devices are generally manufactured by selectively and repetitively performing various processes on a substrate, namely a semiconductor wafer. These processes typically include a photolithography process, an etch process, a diffusion process, a chemical vapor deposition process, an ion implantation process, and a metal deposition process. Of these processes, the etch process, the chemical vapor deposition process, and the metal deposition process are performed by injecting process gas into a sealed process chamber and exciting the process gas with radio frequency (RF) power to produce plasma.

Known semiconductor device manufacturing equipment of the type that produces plasma includes multi-chambered cluster type of equipment having a plurality of process chambers. The process chambers are integrated so that a plurality of wafers can be processed simultaneously to maximize efficiency in the manufacturing of today's highly integrated semiconductor devices.

More specifically, the multi-chambered equipment includes a central transfer chamber in which a robot is disposed, one or two loadlock chambers at one side of the transfer chamber, and a plurality of process chambers at the other side of the transfer chamber. In addition, the semiconductor device manufacturing equipment has coupling structure by which the loadlock chamber(s) and the process chambers are connected to the central transfer chamber.

The coupling structure of the multi-chambered equipment includes a plurality of O-rings interposed between the contacting surfaces of the chambers so as to establish a seal therebetween. However, the seal is continuously affected by the plasma generated in the process chamber. That is, the structure connecting the transfer chamber and the process chamber is exposed to the plasma generated in the process chamber. The O-rings are particularly susceptible to being damaged by such plasma.

If the O-rings were damaged, gas could leak into or from the process chamber thereby altering the processing conditions in the chamber, i.e., causing processing errors and defects in the product produced in the chamber. Therefore, at present, the O-rings are periodically replaced before they have a chance to become damaged. Specifically, the O-rings are replaced as part of a preventive maintenance (PM) program in which the equipment is also cleaned.

However, the O-rings need to be replaced frequently to prevent them from being damaged by the plasma. Hence, the frequent need to replace the O-rings dictates that the PM be performed frequently. Accordingly, the processes being carried out in the process chambers are frequently interrupted to implement the PM program, which interruption detracts from the productivity of the equipment and contributes to high production costs.

SUMMARY OF THE INVENTION

An object of the present invention is to provide structure for creating a reliable seal between a transfer chamber and another chamber connected thereto, such as a process chamber.

Still another object of the present invention is to provide sealing structure between a transfer chamber and another chamber connected thereto, which ensures that the annular seal(s) of the structure has/have a long useful life.

Yet another object of the present invention is to provide sealing structure between a transfer chamber and a process chamber, which prevents the annular seal(s) of the structure from being damaged by plasma used to process substrates in the process chamber.

Still another object of the invention is to provide a universal method of assembly for the chambers of multi-chambered substrate processing equipment, in which a reliable seal can be created between chambers of the equipment and/or annular seal(s) used in assembling the equipment will have a long useful life.

In accordance with one aspect of the invention, there is provided sealing structure for substrate processing equipment that includes at least one annular seal, and a docking member having an extension that can be fitted into the passageway of a chamber connected to a transfer chamber of the equipment, wherein the extension projects to one side of the location at which the at least one annular seal is disposed to thereby protect the seal. The sealing structure may also include an insert member fixed to the exterior of the transfer chamber and to which the docking member is fixed.

In accordance with another aspect of the invention, there is provided semiconductor plasma processing equipment whose sealing structure includes an insert member fixed to the exterior of a transfer chamber, at least one annular seal, and a docking member fixed to the insert member. The insert member is interposed between a portal of the process chamber and the transfer chamber. Also, the insert member has a through-hole located between the passageways of the transfer and process chambers. The docking member has a passageway extending therethrough and connecting the passageways of the transfer and process chambers. The docking member also has a support portion extending within the through-hole of the insert member, and an extension extending within the passageway of the portal of the process chamber. The extension is disposed to one side of the location at which the annular seal(s) is/are disposed so that the extension prevents the seal(s) from being exposed to the plasma.

Preferably, the docking member also has a support portion received in the insert member, and a flange received in a passageway of the transfer chamber. The extension, support portion and flange have different outer diameters in cross section such that inclined surfaces extend between the outer peripheral surfaces of the flange, the support portion and the extension. A respective annular seal is disposed along at least one of the inclined surfaces.

According to another aspect of the present invention, there is provided a method of assembling substrate processing equipment comprising: providing a docking member having a passageway extending therethrough and an extension at one end thereof, fixing the docking member to a transfer chamber with the extension projecting outwardly from the transfer chamber, providing an annular seal along a surface of the docking member located to one side of the extension, inserting the extension of the docking member into a passageway of another chamber constituting a portal of the other chamber such that the passageways of the docking member and other chamber are aligned, and fixing the other chamber to the transfer chamber with the portal of the other chamber facing the transfer chamber and the passageways of said chambers aligned.

BRIEF DESCRIPTION OF THE DRAWINGS

The above and other objects, features and advantages of the present invention will become more apparent to those of ordinary skill in the art by referring to the following detailed description of the preferred embodiments thereof made with reference to the attached drawings in which.

DETAILED DESCRIPTION OF THE PREFERRED EMBODIMENTS

The present invention will now be described in more detail with reference to the accompanying drawings in which like reference numbers designate like elements throughout.

Figure 1:
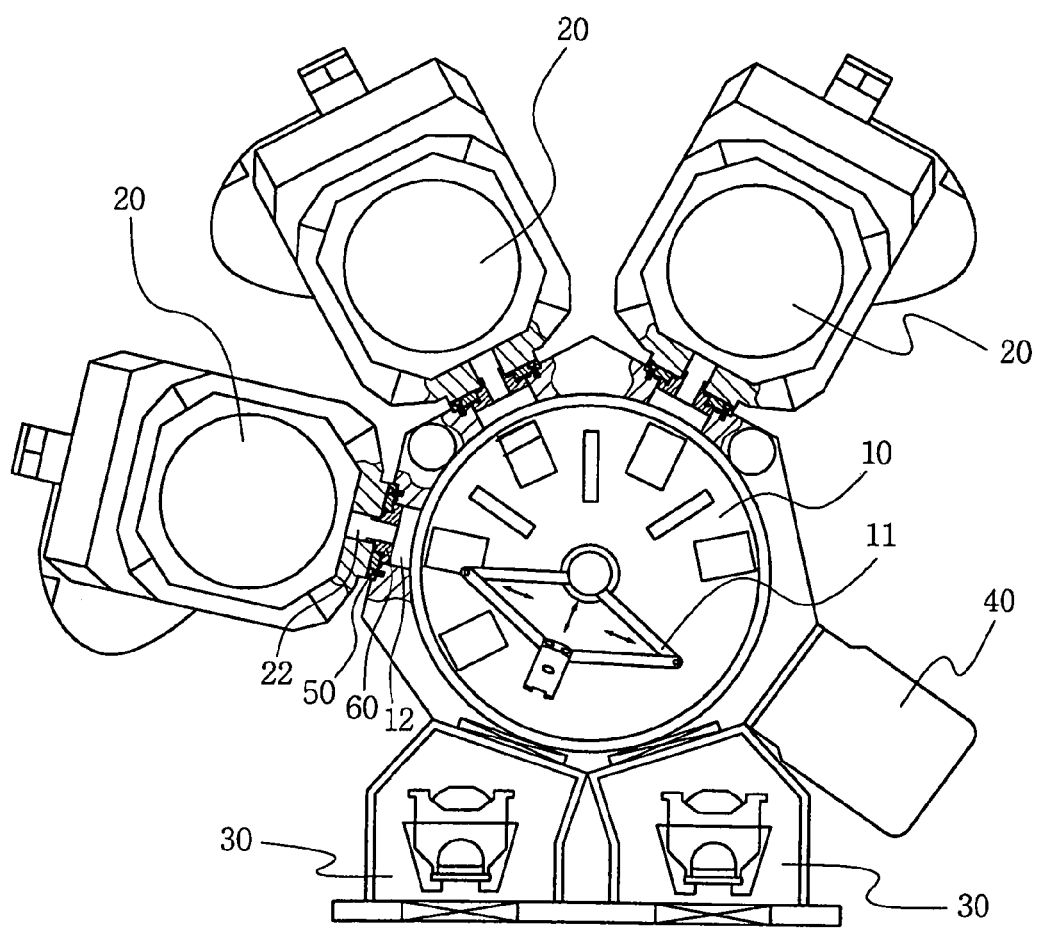
FIG. 1 is plan view of multi-chambered semiconductor device manufacturing equipment according to the present invention.

Referring first to FIG. 1 multi-chambered substrate processing equipment according to the present invention includes a transfer chamber 10, two or more process chambers 20 and at least one loadlock chamber 30. The process chambers 20 and loadlock chamber(s) 30 are disposed opposite to each other with respect to the transfer chamber 10. That is, the transfer chamber 10 is disposed at the center of the apparatus. In addition, a robot 11 for loading/unloading wafers into and from the process and loadlock chambers 20 and 30 is disposed in the transfer chamber 10.

Furthermore, the sidewall of the transfer chamber 10 has a plurality of wafer passageways 12 extending therethrough adjacent the process chambers 20 and loadlock chamber(s) 30, respectively. The passageways 12 are large enough to allow a wafer held by an arm of the robot 11 to pass therethrough. In other words, each wafer passageway 12 of the transfer chamber 10 has a width greater than the diameter of the wafer, and a height greater than the thickness of the wafer or the combined thickness of the wafer and a vertical distance over which the arm of the robot is moved when loading/unloading a wafer into/from the chamber via the passageway 12.

Each process chamber 20 is a chamber in which a substrate, such as a semiconductor wafer, is processed. To this end, a chuck is disposed in the process chamber for supporting a wafer while it is being processed, a process gas supply system is connected to the process chamber 20 to supply a process gas toward the wafer seated on the chuck, and radio frequency (RF) power source is connected to the process chamber in such a way as to apply RF power to the process gas. Thus, plasma is generated in the process chamber 20 by the application of RF power to the process gas supplied toward the wafer. The plasma may form a film on the wafer, ash a film or etch a film (that has already been formed on the wafer) into a certain pattern. Gas remaining after the plasma is formed and byproducts of the etching process or the like are discharged from the process chamber 20 through a turbo exhaust line provided at one side or the bottom of the process chamber.

The loadlock chamber 30, on the other hand, merely receives a carrier, e.g., a wafer cassette, in which a plurality of wafers are supported as spaced from one another. The wafers are loaded/unloaded into/from the carrier one-by-one while the carrier remains on standby in the loadlock chamber 30. A recently developed alternative to providing the wafer cassette in the loadlock chamber is a front open unified pod (FOUP). The FOUP has a front door and is designed to be coupled to a load port of the loadlock chamber 30. Also, the FOUP is configured to directly support a plurality of wafers or to accommodate a carrier in which the plurality of wafers are supported. When the FOUP is coupled to the load port of the loadlock chamber, the load port opens the front door of the FOUP. Then the robot 11 can load/unload the wafers one-by-one into/from the FOUP through the loadlock chamber. As is typical with the use with FOUPs, two loadlock chambers 30 are provided as each connected to the transfer chamber, as shown in FIG. 1.

The multi-chambered substrate processing equipment may also include a wafer aligning chamber 40 connected to the transfer chamber. The transfer chamber 10 also has a passageway in the side wall thereof adjacent the wafer aligning chamber 40 for facilitating the transfer a wafer to and from the wafer aligning chamber 40 by the robot 11. The wafer aligning chamber 40 accommodates a device that aligns wafers prior to their transport by robot 11 into the process chambers 20. More specifically, each wafer should be oriented in the same predetermined direction when the wafer is loaded by the robot 11 into a process chamber 20 so that the wafers are all processed the same in the process chamber. Likewise, each wafer should be oriented in the same predetermined direction when the wafer is loaded by the robot 11 into a loadlock chamber 30 so that the wafers can be subsequently processed all in the same way. However, the orientation of a wafer may be changed a little bit by the robot 11 as the robot 11 unloads a wafer from a process chamber or loadlock chamber. The wafers are thus transported to the wafer aligning chamber 40 to realign the wafers so that the wafers will all have the same orientation when the wafers are transported to a process chamber 20 or loadlock chamber 30.

The process chambers 20, the loadlock chambers 30 and the wafer aligning chamber 40, described above, are detachably connected to the transfer chamber 10 to facilitate changes to the processing of wafers. That is, the transfer chamber 10 is provided in common, and different types of process chambers can be connected to the transfer chamber 10 so that various processes can be performed by the equipment. For example, the process chamber 20 connected to the transfer chamber 10 may constitute a deposition apparatus such that the equipment processes wafers by forming films on the wafers. On the other hand, a processing chamber 20 constituting an etching apparatus may be connected to the transfer chamber 10, in which case the equipment processes wafers by etching films that have already been formed on the wafers. Also, one or more loadlock chambers 30 of a type that is suited to the processes carried out in the process chambers 20 is/are connected to the transfer chamber 10.

An important consideration in connecting the process and loadlock chambers 20 and 30 to the transfer chamber 10 is the creation of a seal between the transfer chamber 10 and the process and loadlock chambers. More specifically, substrate processing equipment to which the present invention pertains processes the substrates in a specific process environment, e.g., at a specific pressure and temperature.

In semiconductor device manufacturing equipment using plasma, in particular, a vacuum is maintained in the process chamber 20 as a wafer is being processed in the chamber 20. The same vacuum state that is maintained in the process chamber 20 must be maintained in the transfer chamber 10 when a wafer is transported by the robot 11 into the process chamber 20 from the transfer chamber 10.

The loadlock chamber 30 is exposed to the environment outside the equipment when, for example, the carrier in which the plurality of wafers are supported is loaded/unloaded into/from the loadlock chamber. However, the loadlock chamber 30 is completely isolated from the environment outside the equipment, and the same process atmosphere that prevails in the transfer chamber 10 is maintained in the loadlock chamber 30 when a wafer is loaded/unloaded by the robot 11 into/from the carrier in the loadlock chamber 30.

Thus, sealing the connections between the transfer chamber 10 and the surrounding chambers, such as the process chamber 20, the loadlock chamber 30, and the wafer aligning chamber 40, is a major factor in the performance of the equipment. The structure for connecting and establishing a seal between the transfer chamber 10 and one of the surrounding chambers will now be described in more detail with reference to FIGS. 2-7. Although such structure is illustrated in connection with a process chamber 20, understandably, the sealing structure of the present invention also applies to the connection between the transfer chamber and other types of chambers, such as the loadlock chamber 30 and wafer aligning chamber 40.

Figure 2:
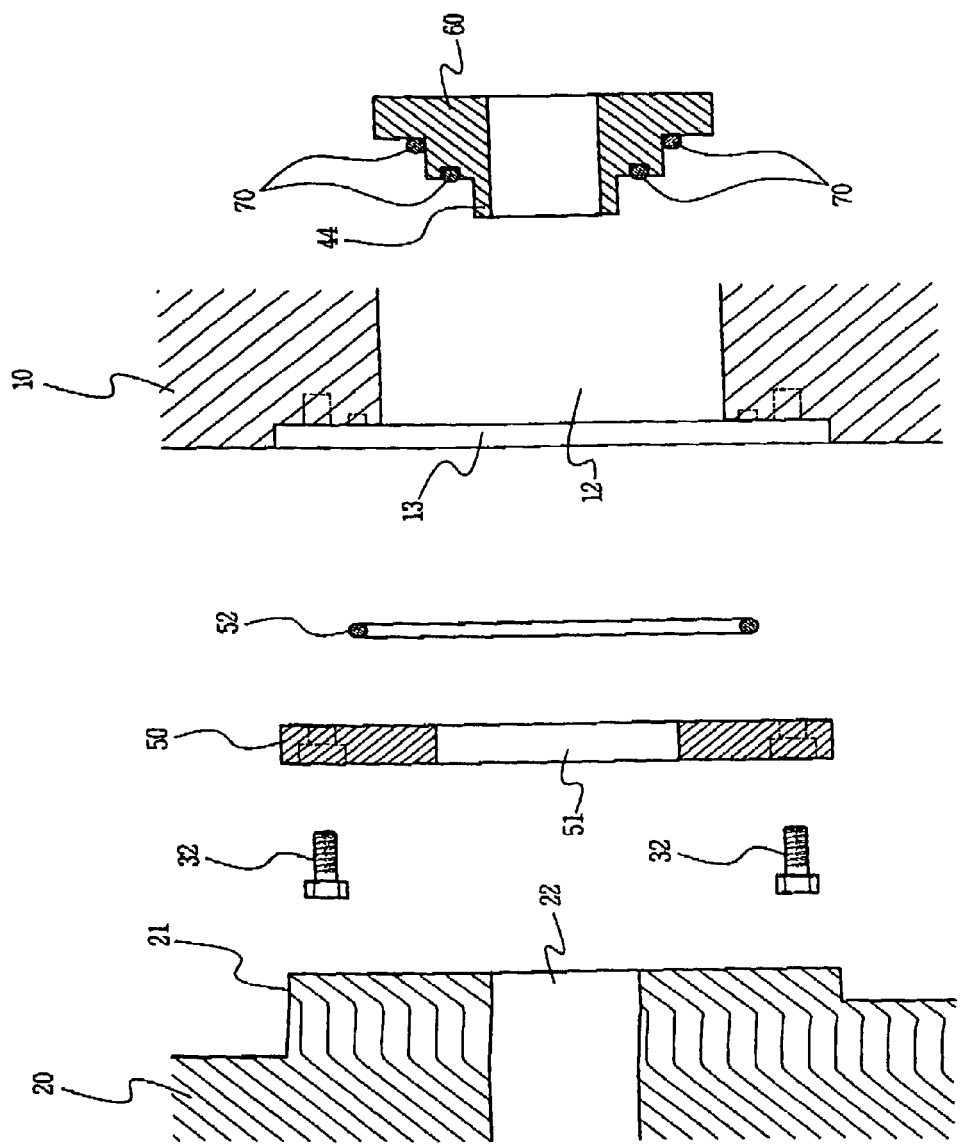
FIG. 2 is an exploded sectional view of structure used to create a seal between a transfer chamber and a process chamber of the equipment.
Figure 3:
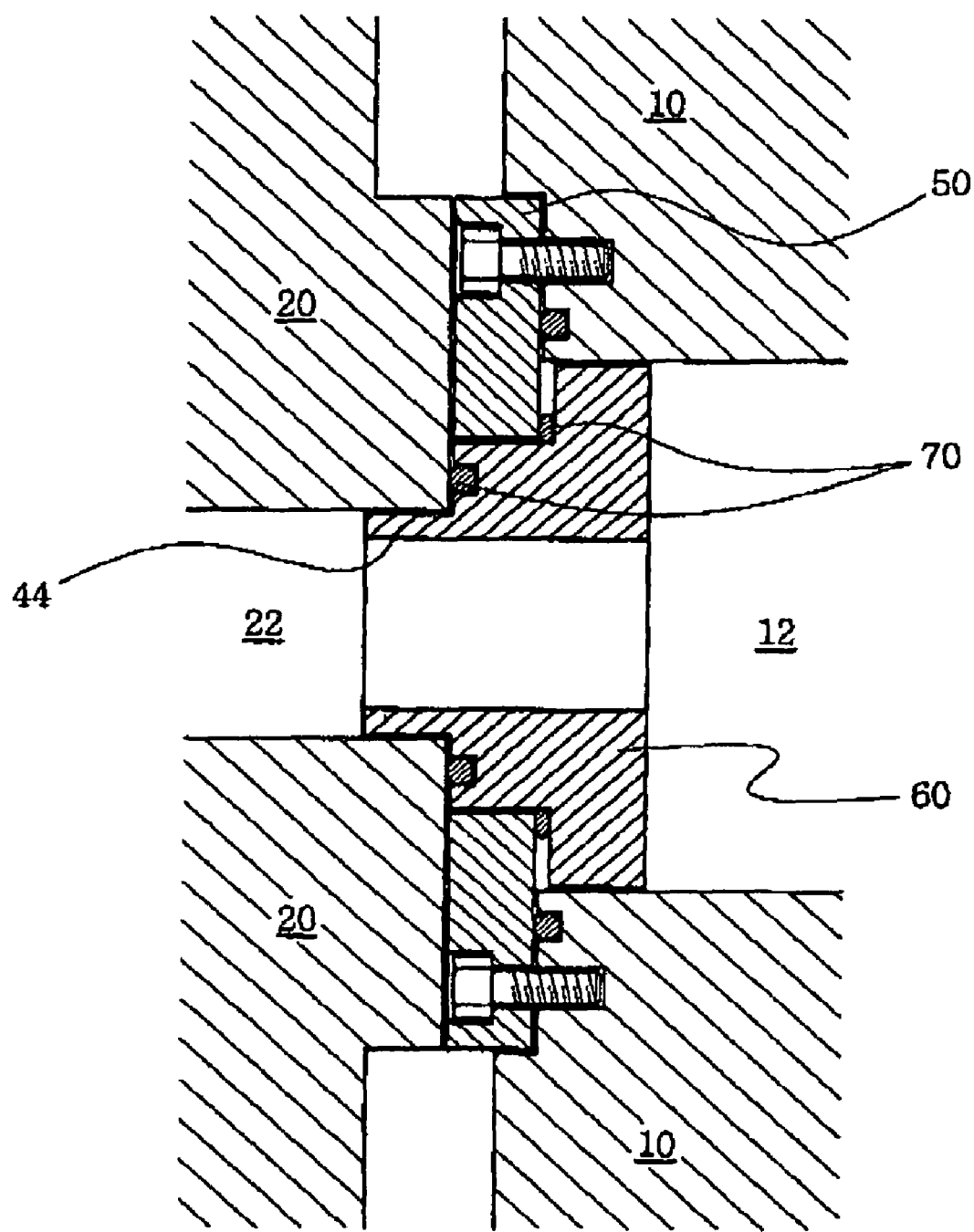
FIG. 3 is a sectional view of the structure shown in FIG. 2, illustrating the structure assembled between the transfer chamber and process chamber.

Referring now to FIGS. 2 and 3, the sealing structure includes an insert member 50 and a docking member 60 coupled to the transfer chamber 10. The insert member 50 and docking member 60 space the process chamber 20 a certain distance from the transfer chamber 10.

In particular, one end of the docking member 60 is received in the passageway 12 of the transfer chamber 10. The other end 44 of the docking member 60 is fitted to a portal 21 of the process chamber 20, i.e., is received in a wafer passageway 22 of the process chamber 20, in such a way as to space the portal 21 of the process chamber 20 from the transfer chamber 10. In this respect, the portal 21 of the process chamber forms a protrusion at the exterior of the process chamber 20.

Also, a groove 13 extends in the outer surface of the side wall of the transfer chamber 10 around the passageway 12. The groove 13 is contiguous with the passageway 12. The insert member 50 is fitted to the transfer chamber 10 in the groove 13, i.e., the insert member 50 has a shape corresponding to that of the groove 13, such that the insert member 50 contacts a surface of the transfer chamber 10 that defines the bottom of the groove 13. An annular seal 52 may be interposed between the insert member 50 and the surface of the transfer chamber 10 that defines the bottom of the groove 13.

Moreover, the insert member 50 is securely fixed to the transfer chamber 10 by mechanical fasteners such as bolts or screws 50. However, the thickness of the insert member 50 is greater than the depth of the groove 13 so that a portion of the insert member 50 protrudes from the groove 13. An outer surface of the insert member 50 contacts an outer end surface of the portal 21 of the process chamber 20.

The insert member 50 also has a through-hole 51 concentric with the wafer passageway 12 and whose shape is similar to but slightly smaller than that of the wafer passageway 12. The shape of the wafer passageway 22 of the process chamber 20, which forms part of the portal 21, is similar to but smaller than that of the through-hole 51 of the insert member 50. Thus, the wafer passageway 12, through-hole 51 and wafer passageway 22 together form a stepped passageway through which a wafer passes between the transfer chamber 10 and the process chamber 20.

The docking member 60 prevents gas from leaking from the stepped passageway. To this end, the docking member 60 is disposed in surface-to-surface contact with both the portal 21 of the process chamber 20 and the insert member 50, and annular seals 70 are interposed between the contacting surfaces. Also note, the docking member 60 provides a seat for a slit valve (not shown) that is operable to open/close the passageway between the transfer chamber 10 and the process chamber 20.

The annular seals 70 are each of the same material as the annular seal 52 interposed between the contacting surfaces of the insert member 50 and the transfer chamber 10. In this respect, the annular seals 70 and 52 may be of rubber, tetrafluoroethylene (Teflon®) or metal. The choice of material depends on the environmental factors existing in the equipment. That is, if the environmental factors require that an annular seal be particularly durable, the seal is made of metal, i.e., a comparatively strong material. In comparison, if the contacting surfaces are particularly susceptible to being exposed to plasma, the seal may be of Teflone® which is known to be particularly resistant to the plasma. One or more of the annular seals may also be of rubber, of the type used for O-rings, because rubber will best ensure that an airtight seal is maintained between the contacting surfaces. That is, the elasticity of the annular rubber seal will serve to maintain the air-tightness between the opposing surfaces even when the members having the opposing surfaces move slightly relative to one another.

Thus, in the case in which the substrate processing equipment has a processing chamber that produces plasma to process a substrate, the seal at a portion of the structure that is likely to be most affected by the plasma, e.g., the annular seal 70 that is closest to the process chamber 20, is made of Teflon®. On the other hand, one or more of the other annular seals 50 and 70 used at portions of the structure that are less likely to be affected by the plasma may be of rubber. Accordingly, the present invention provides a sealing structure that prevents the annular seals from being damaged by the plasma.

Figure 4:
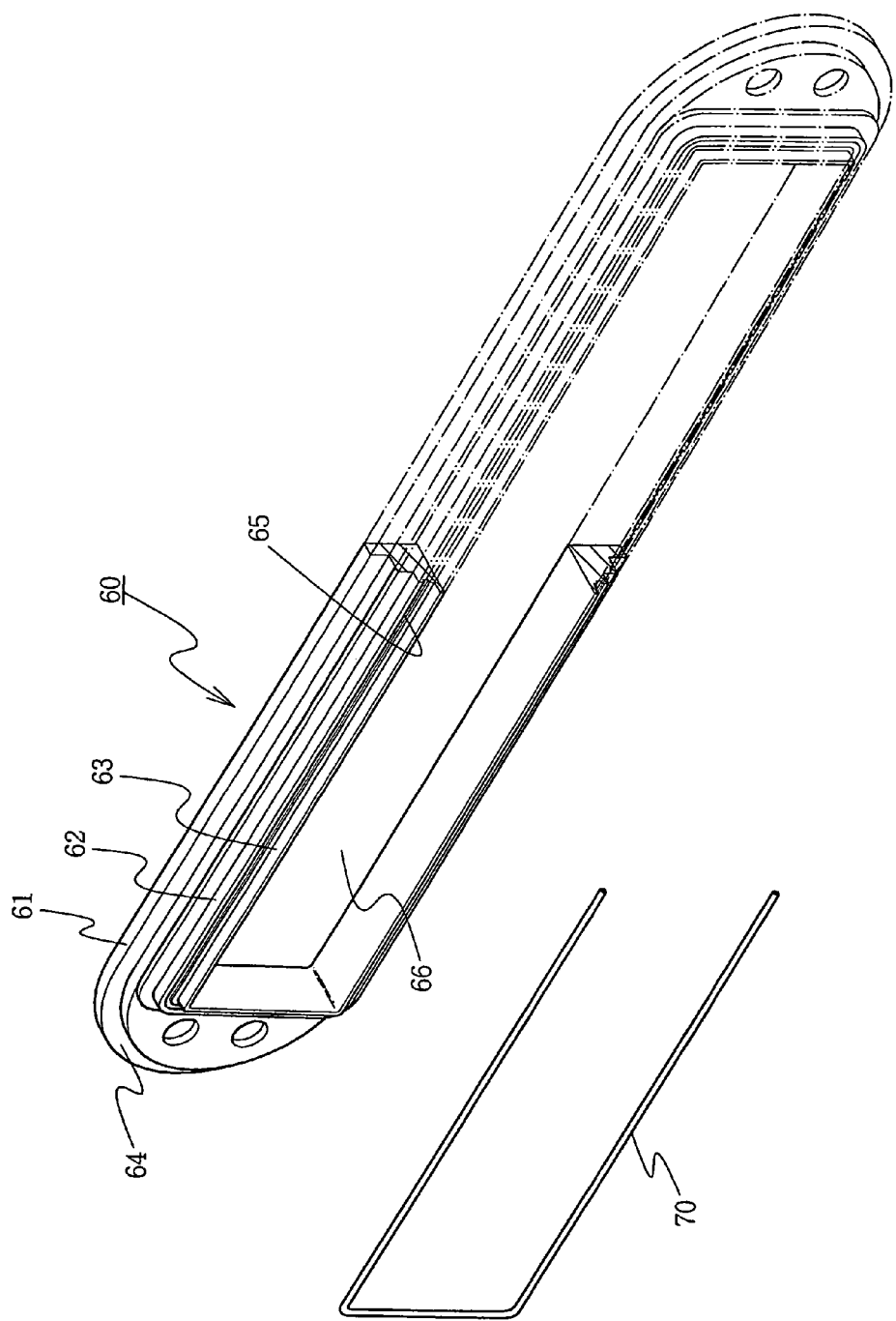
FIG. 4 is a perspective view, partially in section, of a docking plate of the sealing structure according to the present invention.
Figure 5:
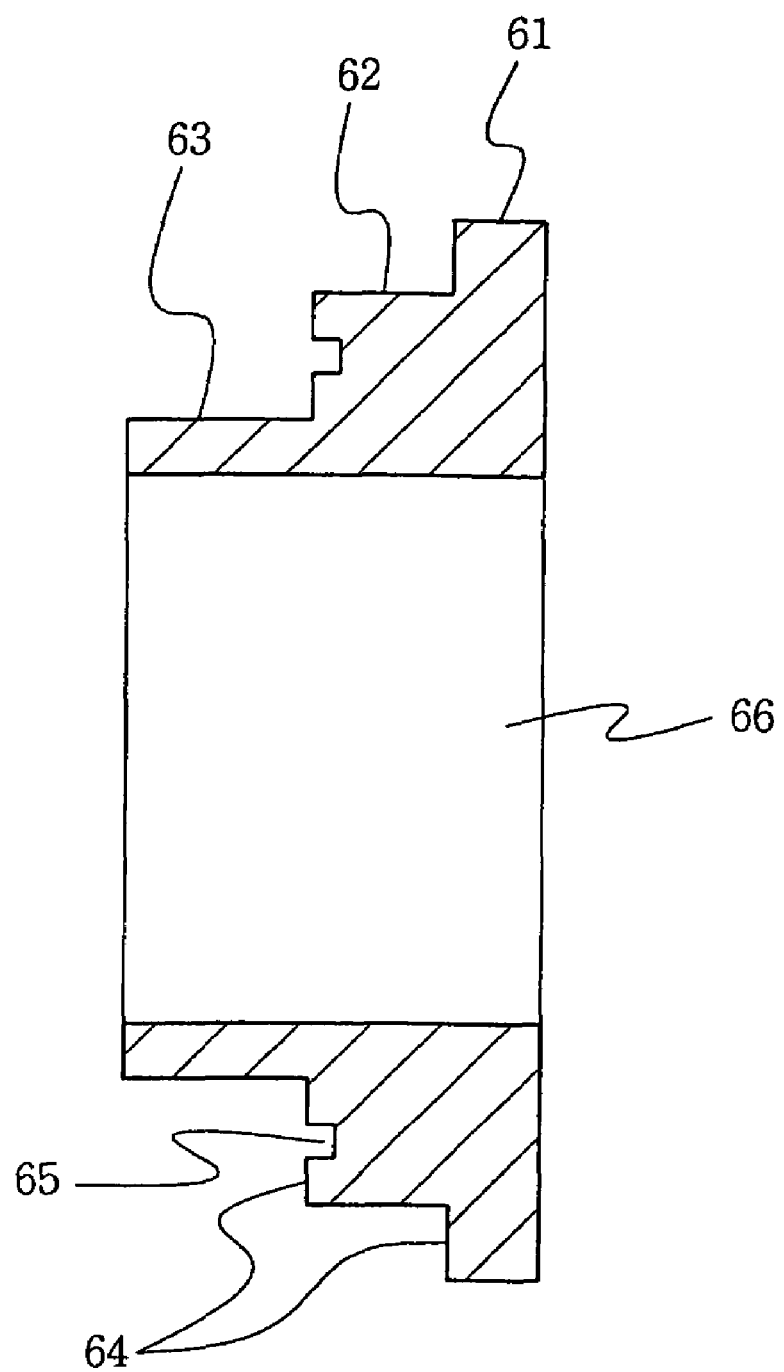
FIG. 5 is a sectional view of the docking plate.

Further in this respect, and as is best seen in FIGS. 3, 4 and 5, the docking member 60 has a passageway 66 extending axially therethrough to connect the wafer passageways 12 and 22 of the transfer and process chambers 10 and 12. The passageway 66 is concentric to and hence, aligned with the wafer passageways 12 and 22 and with the through-hole of the insert member 50. The docking member 60 also includes a flange 61 at one end thereof, a central support portion 62, and an extension 63 at the other end thereof.

The flange 61 is received in the wafer passageway 12 as fitted to the transfer chamber 10 with the outer peripheral surface thereof confronting the interior surface of the transfer chamber 10 that defines the wafer passageway 12. The central support portion 62 is received in the through-hole 51 with the outer peripheral surface thereof confronting the inner peripheral surface of the insert member 50 that defines the through-hole 51. The extension 63 is received in the wafer passageway 22 with the outer peripheral surface thereof confronting the interior surface of the portal 21 that defines an end of the wafer passageway 22. Thus, the extension 63 is disposed to one side of the locations at which the annular seals 70 are disposed Moreover, the flange 61, the central support portion 62, and the extension 63 have different outer diameters in cross section so that the docking member 60 has three steps in the outer periphery thereof. Specifically, when the docking member 60 is viewed in cross section, the central support portion 62 has an outer diameter smaller than that of the flange 61, and the extension 63 has an outer diameter smaller than that of the support portion 62. The inclined surface 64 that extends between the outer peripheral surfaces of the support portion 62 and the extension 63 has an annular grooves 65 in which an annular seal 70 is seated.

The docking member 60 can be inserted into the wafer passageway 12 from the inside of the transfer chamber 10. At this time, the annular seals 70 are pressed against the portal 21 of the process chamber 20 and the insert member 50, respectively, so that seals are created between the surfaces 64 of the docking member 60 that contact the portal 21 and the insert member 50. In addition, the flange 61 of the docking member 60 is fixed to the insert member 50, from the inside of the transfer chamber 10, using fixing means such as bolts or screws. Furthermore, the transfer chamber 10 and the process chamber 20 are securely fixed to each other from the outside using a clamp (not shown).

Figure 6:
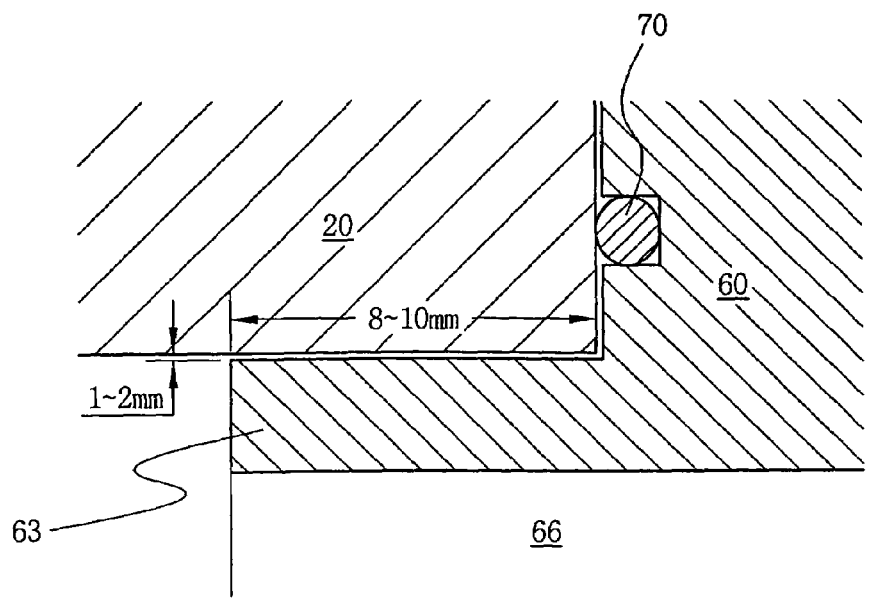
FIG. 6 is an enlarged sectional view of a portion of the docking plate, illustrating an extension of the docking plate received in a process chamber.
Figure 7:
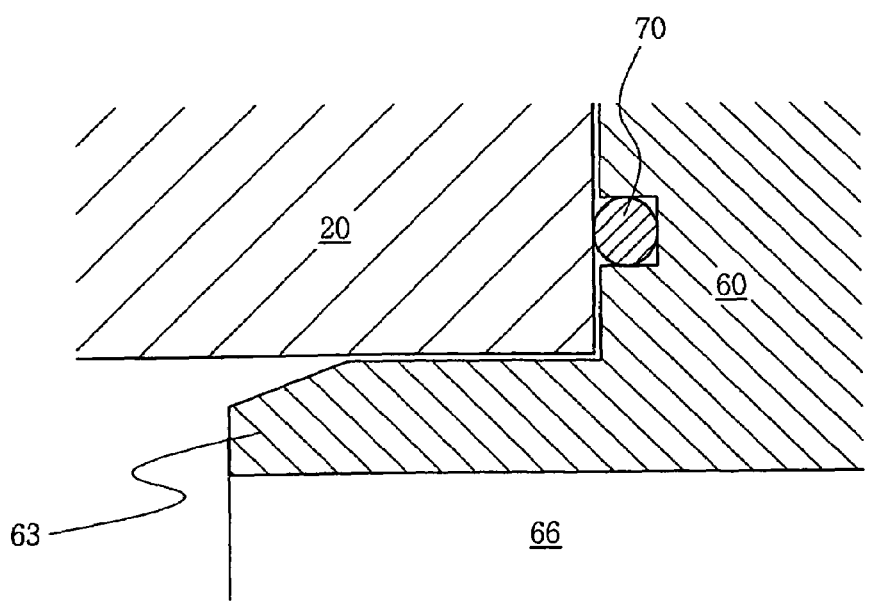
FIG. 7 is an enlarged sectional view of a portion of another form of the docking plate, also illustrating the extension of the docking plate received in a process chamber.

With the equipment assembled as described above, the extension 63 of the docking member 60 projects by about 8 to 10 mm into the portal of the process chamber 20, as illustrated in FIG. 6. Also, a gap is defined between the process chamber 20 and the extension 63 of the docking member 60 to prevent the docking plate member from firmly adhering to the process chamber 20 within the wafer passageway 22. Preferably, the wafer passageway 22 of the process chamber 20 has a diameter of 45 to 46 mm, and the extension 63 of the docking member 60 has an outer diameter of 44 to 45 mm, so that the gap therebetween is 1 to 2 mm. In addition, as illustrated in FIG. 7, the outer diameter of the distal end of the extension 63 in cross section decreases in a direction away from the support portion 62. The distal end of the extension 63 of the docking member 60 may be tapered in this way so that the extension 63 can be easily inserted into the wafer passageway 22.

Thus, the narrow and long gap between the extension 63 of the docking member 60 and the portal 21 of the process chamber 20 prevents the plasma generated in the process chamber 20 from reaching the annular seats 70, thereby preventing the annular seals 70 from being damaged. Accordingly, the annular seals 70 do not have to be frequently replaced. Eventually, however, the annular seals 70, if made of rubber especially, do have to be replaced to prevent them from being damaged by the high temperature conditions that may exist in the process chamber 20. Nevertheless, the period for replacement is considerably longer than if the same annular seals were also exposed to plasma. Accordingly, the processing of the substrates is allowed to run for long periods of time without interruption. Moreover, the downtime associated with the assembly and disassembly of the equipment for implementing the preventative maintenance associated with the annular seals is minimized. Therefore, the run time of the equipment is maximized and hence, the productivity of the equipment is maximized.

As mentioned above, the sealing structure of the present invention also applies to the connection between the transfer chamber and other types of chambers, such as the loadlock and wafer aligning chambers 30 and 40. Although these other chambers do not present the potential problem of damage to the annular seals due to plasma, the docking member 60 is still advantageous in terms of providing a reliable and complete seal between the chambers. In particular, the shape of the docking member 60 is readily adaptable to conform to any passageway formed between the transfer chamber 10 and a surrounding chamber. Thus, existing equipment can be easily retrofitted with the present invention.

Finally, although the present invention has been described in connection with the preferred embodiments thereof, it is to be understood that the scope of the invention is not limited to the disclosed embodiments. On the contrary, various modifications of the preferred embodiments, as will be apparent to persons skilled in the art, are seen to be within the true spirit and scope of the invention as defined by the appended claims.

What is claimed is:

1. Substrate processing equipment comprising:
a transfer chamber having a passageway open at the exterior thereof;
a process chamber in which a substrate is processed using plasma, the process chamber having a passageway and a portal through which the passageway extends to the exterior of the process chamber, the process chamber being connected to the transfer chamber with the portal facing the transfer chamber so that the passageways of the transfer and process chambers are aligned; and
sealing structure that provides a seal between the transfer and process chambers, the sealing structure including an insert member fixed to the exterior of the transfer chamber and interposed between the portal of the process chamber and the transfer chamber, the insert member having a through-hole located between the passageways of the transfer and process chambers,
at least one annular seal, and
a docking member fixed to the insert member and having a passageway extending therethrough connecting the passageways of the transfer and process chambers, and the docking member having a support portion extending within the through-hole of the insert member, and an extension extending within the passageway of the portal of the process chamber, the extension being disposed to one side of the location at which the at least one annular seal is disposed, whereby the extension prevents the at least one annular seal from being exposed to the plasma used to process substrates in the process chamber.

2. The equipment according to claim 1, wherein the support portion of the docking member has an outer diameter in cross section that is larger than that of the extension of the docking member, and an inclined surface that extends at an inclination relative to and between the outer peripheral surface of the support portion and the outer peripheral surface of the extension, and said at least one annular seal comprises an annular seal disposed along said inclined surface.

3. The equipment according to claim 1, wherein said at least one annular seal comprises an annular seal disposed at an interface of the insert member and the transfer chamber.

4. The equipment according to claim 1, wherein the docking member further comprises a flange at one end thereof, the flange being disposed in the passageway of the transfer chamber, and the support portion has an outer diameter in cross section that is smaller than that of the flange, and the extension has an outer diameter in cross section that is smaller than that of the support portion.

5. The equipment according to claim 4, wherein the docking member has an inclined surface that extends at an inclination relative to and between the outer peripheral surface of the flange and the outer peripheral surface of the support portion, and the at least one annular seal comprises an annular seal that is disposed along said inclined surface.

6. The equipment according to claim 4, wherein the docking member has an inclined surface that extends at an inclination relative to and between the outer peripheral surface of the support portion and the outer peripheral surface of the extension, and said at least one annular seal comprises an annular seal disposed along said inclined surface.

7. The equipment according to claim 6, wherein the docking member has an annular groove extending within said inclined surface, and the annular seal is seated in the groove.

8. The equipment according to claim 1, wherein the outer diameter of a distal end of the extension in cross section decreases in a direction away from the support portion such that the distal end of the extension is tapered.

9. The equipment according to claim 1, wherein a gap exists between an outer peripheral surface of the extension and an inner peripheral surface of the process chamber that defines the passageway of the process chamber.

10. The equipment according to claim 9, wherein the gap is 1 to 2 mm.

11. In substrate processing equipment including a transfer chamber having a passageway open to the exterior thereof, a robot disposed in the transfer chamber, and another chamber connected to the transfer chamber and having a passageway aligned with the passageway of the transfer chamber, sealing structure that provides a seal between the transfer chamber and said another chamber, wherein the sealing structure comprises:
at least one annular seal; and
a docking member fixed to the transfer chamber and having a passageway extending therethrough connecting the passageways of the transfer chamber and said another chamber, and the docking member having an extension projecting into the passageway of said another chamber, the extension being disposed to one side of the location at which the at least one annular seal is disposed.

12. The sealing structure in substrate processing equipment according to claim 11, wherein the docking member has a support portion from which the extension projects into the passageway of said another chamber, the support portion has an outer diameter in cross section that is larger than that of the extension, the docking member has an inclined surface that extends at an inclination relative to and between the outer peripheral surface of the support portion and the outer peripheral surface of the extension, and said at least one annular seal comprises an annular seal disposed along said inclined surface.

13. The sealing structure in substrate processing equipment according to claim 11, further comprising an insert member fixed to the exterior of the transfer chamber and interposed between said another chamber and the transfer chamber, the insert member having a through-hole located between the passageways of said another chamber and the transfer chamber, and wherein said docking member is fixed to said insert member.

14. The sealing structure in substrate processing equipment according to claim 12, wherein the diameter of the through-hole of the insert member in cross section is greater than that of the passageway of said another chamber, the docking member has a support portion disposed in the through-hole of the insert member, the support portion has an outer diameter in cross section that is larger than that of the extension, the docking member has an inclined surface that extends at an inclination relative to and between the outer peripheral surface of the support portion and the outer peripheral surface of the extension, and said at least one annular seal comprises an annular seal disposed along said inclined surface.

15. The sealing structure in substrate processing equipment according to claim 12, wherein the diameter of the through-hole of the insert member in cross section is smaller than that of the passageway of the transfer member, the docking member has a support portion disposed in the through-hole of the insert member, the docking member has a flange disposed within the passageway of the transfer chamber, the flange has an outer diameter in cross section that is greater than that of the support portion, the docking member has an inclined surface that is inclined relative to and extends between the outer peripheral surface of the flange and the outer peripheral surface of the support portion, and said at least one annular seal comprises an annular seal disposed along said inclined surface.

16. A method of assembling substrate processing equipment including a transfer chamber having a passageway open at the exterior thereof, and another chamber having a passageway and a portal at which the passageway opens to the exterior of said another chamber and through which substrates are to be transferred into and out of said another chamber, the method comprising:
providing a docking member having a passageway extending therethrough, and an extension whose outer contour is similar in shape to the contour of the passageway of said another chamber;
fixing the docking member to the transfer chamber with the extension thereof projecting outwardly from the transfer chamber and the passageway of the docking member aligned with the passageway of the transfer chamber;
providing an annular seal along a surface of the docking member located to one side of the extension;
inserting the extension of the docking member into the passageway of said another chamber such that the passageway of the docking member is aligned with the passageway of the said another chamber; and
fixing said another chamber to the transfer chamber with the portal of said another chamber facing the transfer chamber and the passageways of said chambers aligned.

17. The method according to claim 16, wherein said fixing of the docking member to the transfer chamber comprises fastening an insert member to the exterior of the transfer chamber, and fastening the docking member to the insert member.

18. The method according to claim 16, wherein said providing a docking member comprises providing a docking member whose extension has an outer diameter in cross section that is smaller than that of the passageway of said another chamber at the portal, whereby a gap is left between the extension of the docking member and an inner surface of said another chamber that defines the passageway thereof when the extension is inserted into the passageway of said another chamber.

19. The method according to claim 16, wherein the docking member is inserted into the passageway of the transfer chamber from inside the transfer chamber after said another chamber has been fixed to the transfer chamber.

* * * * *